(12) United States Patent
Wacker

(10) Patent No.: US 9,911,965 B2
(45) Date of Patent: *Mar. 6, 2018

(54) BATTERY BACKUP COVER SYSTEM

(71) Applicant: ESPI LLC, Clay Center, KS (US)

(72) Inventor: Christopher T. Wacker, Stillwater, OK (US)

(73) Assignee: ESPI LLC, Clay Center, KS (US)

(*) Notice: Subject to any disclaimer, the term of this patent is extended or adjusted under 35 U.S.C. 154(b) by 0 days.

This patent is subject to a terminal disclaimer.

(21) Appl. No.: 14/603,009

(22) Filed: Jan. 22, 2015

(65) Prior Publication Data

US 2015/0132610 A1 May 14, 2015

Related U.S. Application Data

(62) Division of application No. 13/711,304, filed on Dec. 11, 2012, now Pat. No. 8,964,406.

(51) Int. Cl.
| | | |
|---|---|---|
| H01M 2/34 | (2006.01) | |
| H01M 10/42 | (2006.01) | |
| H01M 2/30 | (2006.01) | |
| H05K 7/02 | (2006.01) | |
| H01M 2/10 | (2006.01) | |

(52) U.S. Cl.
CPC .......... *H01M 2/342* (2013.01); *H01M 2/1072* (2013.01); *H01M 2/30* (2013.01); *H01M 10/425* (2013.01); *H01M 10/4257* (2013.01); *H05K 7/02* (2013.01); *H01M 2220/10* (2013.01)

(58) Field of Classification Search
CPC ............... H01M 2/342; H01M 2/1072; H01M 10/4257; H01M 2/30; H01M 2220/10; H01M 10/425; H05K 7/02

USPC ..................... 429/1, 96–100, 175
See application file for complete search history.

(56) References Cited

U.S. PATENT DOCUMENTS

| | | | | |
|---|---|---|---|---|
| 3,763,416 A * | 10/1973 | Jache | ......... | H01M 2/1083 180/68.5 |
| 4,243,289 A * | 1/1981 | Kozel | ......... | H01R 31/00 439/562 |
| 4,756,978 A * | 7/1988 | Nitcher | ......... | H01M 2/1083 180/68.5 |
| 5,820,406 A * | 10/1998 | Hetherington | ....... | G08B 29/181 340/628 |
| 6,117,575 A * | 9/2000 | Dinsdale | ......... | H01M 2/1055 429/1 |
| 6,217,370 B1 * | 4/2001 | Scheel | ......... | H01R 13/6335 439/483 |

(Continued)

OTHER PUBLICATIONS

"ExpertPower EXP1250 12V 5Ah Home Alarm Battery with F1 Terminals: Automotive." Amazon.com: ExpertPower EXP1250 12V 5Ah Home Alarm Battery with F1 Terminals: Automotive. N.p., May 6, 2008. Web. Jul. 6, 2017.*

*Primary Examiner* — Dimary Lopez Cruz
*Assistant Examiner* — Abhishek Rathod
(74) *Attorney, Agent, or Firm* — Polsinelli PC

(57) ABSTRACT

A battery backup unit (BBU) system and apparatus is provided for securing and communicating with a BBU for use with optical network terminals (ONTs) and/or residential gateways. In various aspects, the BBU system includes a battery enclosure that is configured to eliminate the unintentional reversal of the polarity for a battery enclosed therein. The BBU system also provides an integrated communication circuit for receiving a variety of connectors.

26 Claims, 16 Drawing Sheets

(56) References Cited

U.S. PATENT DOCUMENTS

| | | | | |
|---|---|---|---|---|
| D450,653 S * | 11/2001 | Hertel | ............................ | D13/119 |
| D468,261 S * | 1/2003 | Peng | ............................ | D13/119 |
| 6,700,795 B1 * | 3/2004 | Jones | ...................... | H05K 1/141 |
| | | | | 307/10.8 |
| D495,994 S * | 9/2004 | Arakelian | ..................... | D13/103 |
| 7,897,278 B2 * | 3/2011 | Tsai | ..................... | H01M 2/1055 |
| | | | | 320/107 |
| 8,434,115 B1 * | 4/2013 | Wynman | .............. | H04B 10/272 |
| | | | | 725/127 |
| 2006/0023480 A1 * | 2/2006 | Plummer | ........... | B60H 1/00278 |
| | | | | 363/146 |
| 2006/0030215 A1 * | 2/2006 | Wu | ........................ | H01R 24/60 |
| | | | | 439/358 |
| 2008/0018303 A1 * | 1/2008 | Scheucher | ........... | H01M 2/1072 |
| | | | | 320/128 |
| 2008/0042809 A1 * | 2/2008 | Watts | ................... | B60R 25/1003 |
| | | | | 340/426.16 |
| 2008/0305390 A1 * | 12/2008 | Naito | ..................... | H01M 2/105 |
| | | | | 429/159 |
| 2009/0289534 A1 * | 11/2009 | Bernard | .................... | H04Q 1/11 |
| | | | | 312/223.2 |
| 2010/0072809 A1 * | 3/2010 | Newton | ................. | B60T 13/665 |
| | | | | 303/7 |
| 2010/0092845 A1 * | 4/2010 | Spare | ................. | H01M 2/1022 |
| | | | | 429/90 |
| 2010/0181836 A1 * | 7/2010 | Yang | ........................ | H02J 9/061 |
| | | | | 307/66 |
| 2011/0129704 A1 * | 6/2011 | Han | ..................... | H01M 2/1061 |
| | | | | 429/82 |
| 2013/0222991 A1 * | 8/2013 | McWilliams | .......... | G06F 1/1632 |
| | | | | 361/679.4 |
| 2013/0224541 A1 * | 8/2013 | Nam | ..................... | H01M 2/1016 |
| | | | | 429/90 |
| 2013/0302660 A1 * | 11/2013 | Shiraishi | .................. | H01M 2/34 |
| | | | | 429/120 |
| 2014/0023126 A1 * | 1/2014 | Lichoulas | ............... | G06F 13/00 |
| | | | | 375/222 |

* cited by examiner

BATTERY BACKUP COVER SYSTEM

RELATED APPLICATIONS

This application is a divisional application of U.S. patent application Ser. No. 13/711,304, entitled "Battery Backup Cover System," filed on Dec. 11, 2012, now U.S. Pat. No. 8,964,406 issued on Feb. 24, 2015, the entire contents of which are incorporated herein by reference in its entirety.

FEDERALLY SPONSORED RESEARCH OR DEVELOPMENT

Not Applicable.

COMPACT DISK APPENDIX

Not Applicable.

FIELD OF THE INVENTION

The present application relates to a battery cover and connection system, typically used with battery backup units for variety of applications including, but not limited to, optical network terminals (ONTs) of telecommunications systems. In particular, the present application relates to a battery cover that prevents incorrect battery insertion and presents a useful connection system for any application, system, or device that uses an uninterruptable power supply, including an ONT, residential gateways, home security systems, emergency "exit" lights, and wireless access points, among others.

BACKGROUND OF THE INVENTION

An ONT is a terminal of a fiber optic line in a telecommunication network that demultiplexes a signal transmitted through the fiber optic line into its component parts (e.g. voice telephone, television, data, and Internet). The ONT typically derives its power from the electrical supply at the end user's premises; therefore, many ONTs include a battery backup system to maintain service in the event of a power outage.

In some instances, where the battery backup may provide emergency power to only a single customer, while in other instances that telecommunication system may be configured such that the battery backup system provides power for multiple ONT units. Therefore, it is desired that a properly charged and operational battery be installed.

Should the backup battery be installed in correctly, the error may not be discovered until power is lost and the backup battery system is called into service. This may further compound the problems of the initial loss of power, as the improperly installed battery backup may prohibit telephone communication during an emergency. Thus, there is a need for insuring the proper installation of backup batteries, while also providing quick and convenient connections for the battery.

SUMMARY OF THE INVENTION

The present application relates to battery backup system and a battery cover that eliminates instances of incorrectly engaging a battery to device or component including an optical network terminal or a battery charger that leads to polarity reversal of the battery terminals. In one aspect, a battery backup system includes a battery and a battery holder. The battery holder includes a battery holding arm, a circuit housing that includes a circuit board having a plurality of connectors. The battery holder also includes at least one battery engagement tab and a battery connection lead. At least one of the battery engagement tab and the battery connection lead engage the battery in a particular orientation to prevent a polarity reversal of the battery.

In another aspect, a battery backup system for use with an optical network terminal includes a battery for providing power to the optical network terminal when a utility power supply is interrupted and a battery holder engaged to the battery and in electrical communication with the battery to monitor and regulate a battery output power level. The battery holder includes a battery holding arm to slidably engage the battery, a battery engagement tab to secure the battery holder to the battery and at least one battery connection lead to permit the electrical communication with the battery.

The battery holder also includes a circuit housing containing at least one electrical circuit in electrical communication with the battery. The at least one electrical circuit includes an Ethernet cable connector to receive an Ethernet cable, a two-pin receptacle to receive a two-pin plug, at least one wire wrap post to receive a wire, and a cable management system to secure at least one of the Ethernet cable, the two-pin plug, or the wire.

In yet another aspect, a battery cover to prevent a polarity reversal of a connected battery includes a battery engagement tab to engage the battery and at least two battery connection leads to permit electrical communication with the battery. The at least two battery connection leads are oriented within the battery cover such that battery can only be engaged in a particular orientation to prevent the polarity reversal.

In one aspect, the battery back-up system has a battery holder that includes a circuit housing containing at least one electrical circuit in electrical communication with the battery. The at least one electrical circuit includes a power input from a switching power supply and power output to a connected device.

DETAILED DESCRIPTION OF THE INVENTION

Figure 1:
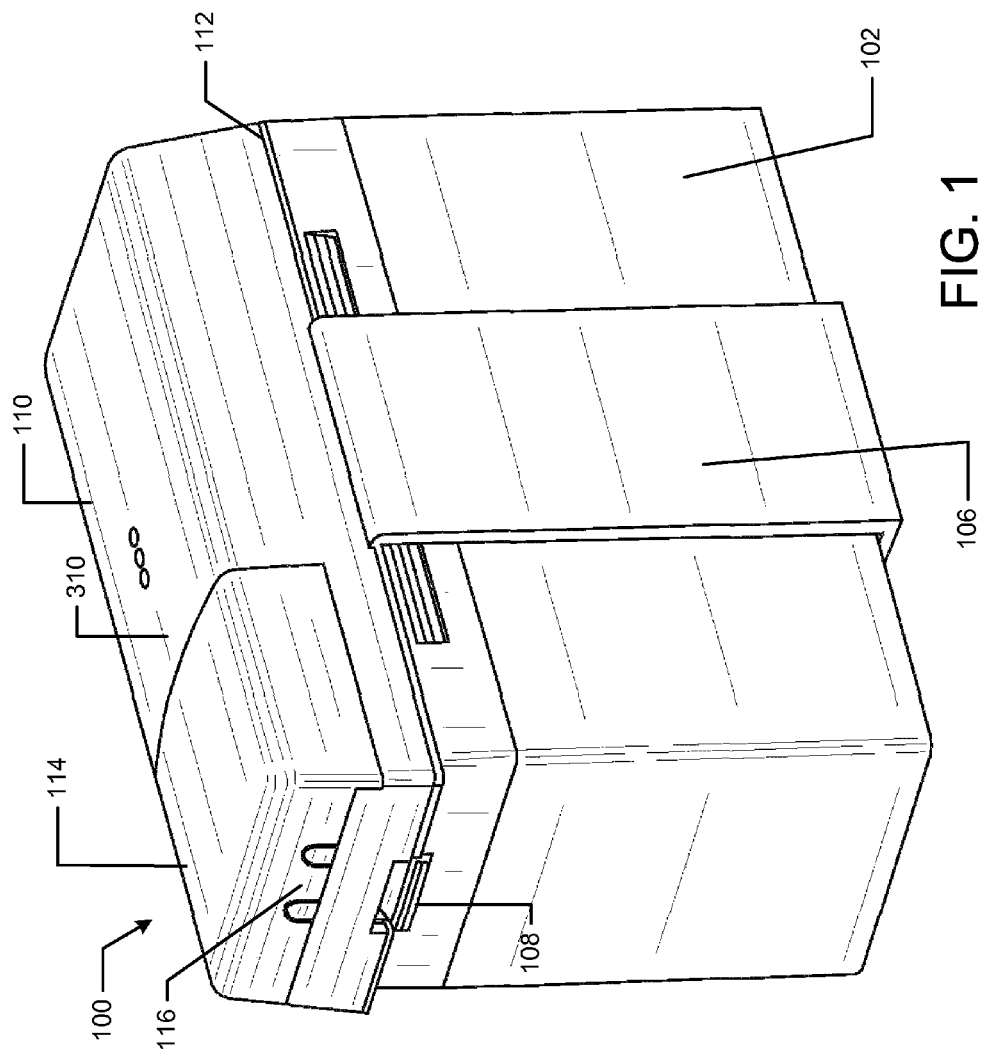
FIG. 1 is an illustration of the battery backup unit system according to one embodiment.

The systems and devices of the present application allow for quick and proper connection of a battery backup unit (BBU) system. The BBU system functions as an uninterruptable power supply (UPS) when electrical power supplied by a utility company is interrupted, thereby allowing the continued use of various systems and devices connected to the BBU system. The BBU system includes a battery and holding enclosure ("battery holder") that provides an interface for connecting the BBU system to a variety of other systems and devices.

In various aspects, the BBU system may be used with an optical network terminal (ONT) located at or near the customer's premises with their telecommunication device. By way of example and not limitation, the BBU system may also be used with a wide variety of other systems, applications, and devices including residential gateways, home security systems, emergency "exit" lights, wireless access points, computing devices and related hardware, and healthcare related machines and devices.

In one aspect, the BBU unit includes a smaller lid compared to other typical devices to provide one of the smallest footprints in the art. In various aspects, the small footprint allows the unit to be used in a number of portable or mobile settings, including direct connections with a solar panel or other devices typically powered by solar energy. Moreover, the smaller footprint allows the BBU to be positioned closer to the connected electronic devices, thereby minimizing or eliminating any voltage losses that may be present with other devices.

The battery holder includes a circuit board for monitoring and regulating an electrical output power level (e.g., a voltage amount and/or current amount) and for receiving and transmitting communications via a telecommunications network. According to one aspect, the battery holder eliminates the need for any exposed connectors that can be compromised by moisture or excessive temperatures. According to another aspect, the battery holder limits the orientation with which the battery holder can be engaged to the top of the battery.

The BBU system of the present application improves installation efficiency and security and eliminates the need for dedicated positive and negative battery leads to prevent installing the battery backwards. Typical safety requirements, such as those suggested by the Underwriters Laboratory (UL), state that a safety diode to prevent connecting the battery terminals backwards must be used with nearly all BBUs. The BBU of the present application provides a secure connection that eliminates any possibility of polarity reversal; therefore, a safety diode is no longer necessary.

In conventional battery connection systems that use, safety diodes, approximately 0.7 volts will be dissipated as heat across such diodes. By eliminating the safety diode, the 0.7 volts remains available for use in powering the ONT, thus making the BBU system of the present application more efficient. By way of example and not limitation, a 12-volt battery may have a typical working range of approximately 10.8 to 13.8 volts. Therefore, the battery has a about a 3 volt range of battery use. If a safety diode is required, then the working range is narrowed to approximately 11.5 to 13.8 volts to account for the 0.7 volts lost to the safety diode. By recapturing the safety diode voltage, the BBU system of the present application provides an approximate 23% increase in battery run time.

FIG. 1 depicts one embodiment of the BBU system 100 with the battery 102 engaged with the battery holder 104. The battery 102 may be any suitable ONT backup battery, including but not limited to lithium-ion batteries, LiFePO4 batteries, and rechargeable lead acid batteries. The battery holder 104 includes an arm 106, at least one engagement tab 108, and a circuit housing 110. The battery holder 104 may be composed of plastic or any other suitable material.

Figure 8:
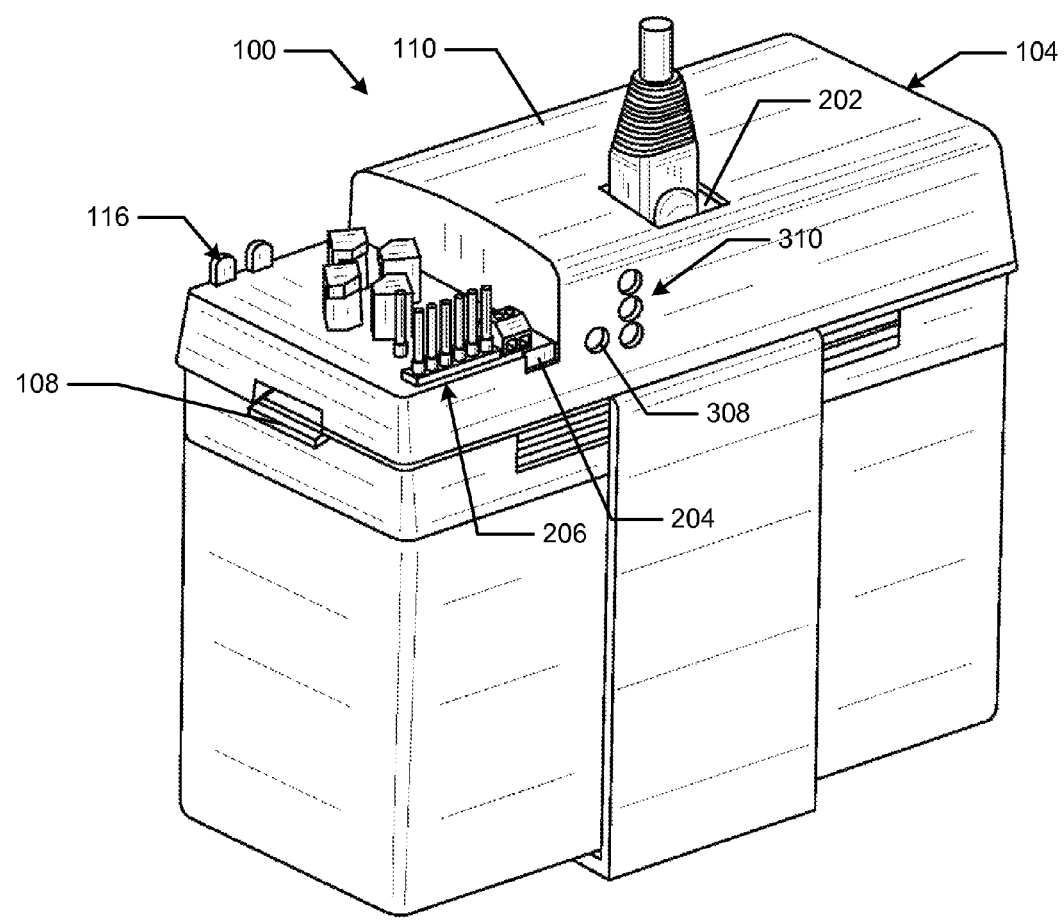
FIGS. 8-12 are illustrations of a battery backup unit system according to one embodiment.
Figure 9:
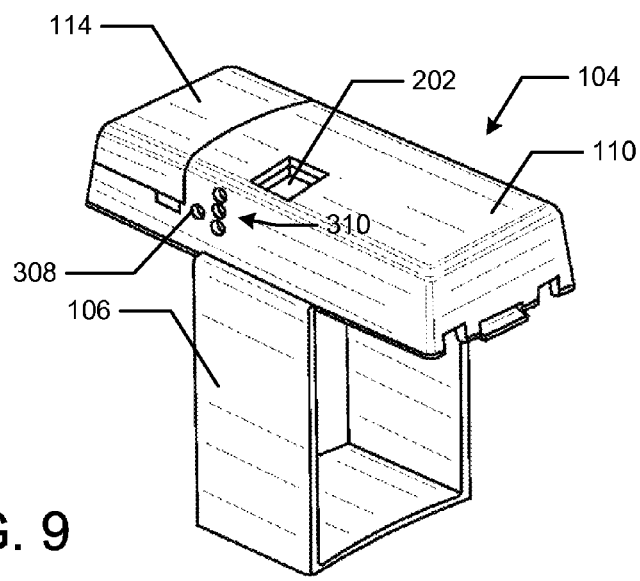
Figure 10:
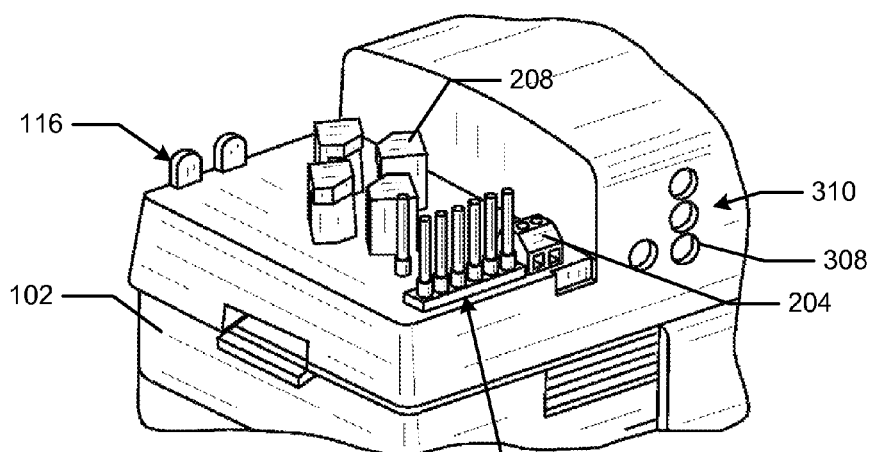

The arm 106 and the engagement tab 108 securely engage the battery holder 104 to the battery 102. In various embodiments, as shown in FIGS. 1 and 8, the arm 106 extends away from the circuit housing 110, to receive and slidably engage the battery 102. The arm 106 is composed of a series of planar members that form a bracket for receiving the battery 102. The "open" end of the bracket is affixed to the circuit housing 110, such that the arm 106 encloses a portion of the battery 102, when the battery holder 104 is engaged to the battery. Similarly, the engagement tab 108 secures the battery 102 to the battery holder 104 by mechanically engaging the battery. For example, the engagement tab 108 may engage the battery 102 through a spring-loaded mechanism, a compressive mechanism, or through the engagement of mated machined parts. Other tab arrangements may be used. In various other embodiments, the arm 106 is optional, and the battery holder may be held to the battery by the engagement tab(s) 108 alone.

In one embodiment, the circuit housing 110 includes a housing base 112 and at least one access cover 114. The access cover 114 defines one or more access ports 116 that are configured to receive one or more cables and/or wires. The access cover 114 and the access ports 116 include weather-resistant seals to prevent dirt and moisture from entering the circuit housing. In another embodiment of the BBU system 100 as shown in FIGS. 15-22C, the battery holder 104 has an open-access configuration, where various connectors including a two position screw terminal 800 for power input and a seven-terminal push-in block 802, for example, are exposed for easier access.

Figure 2:
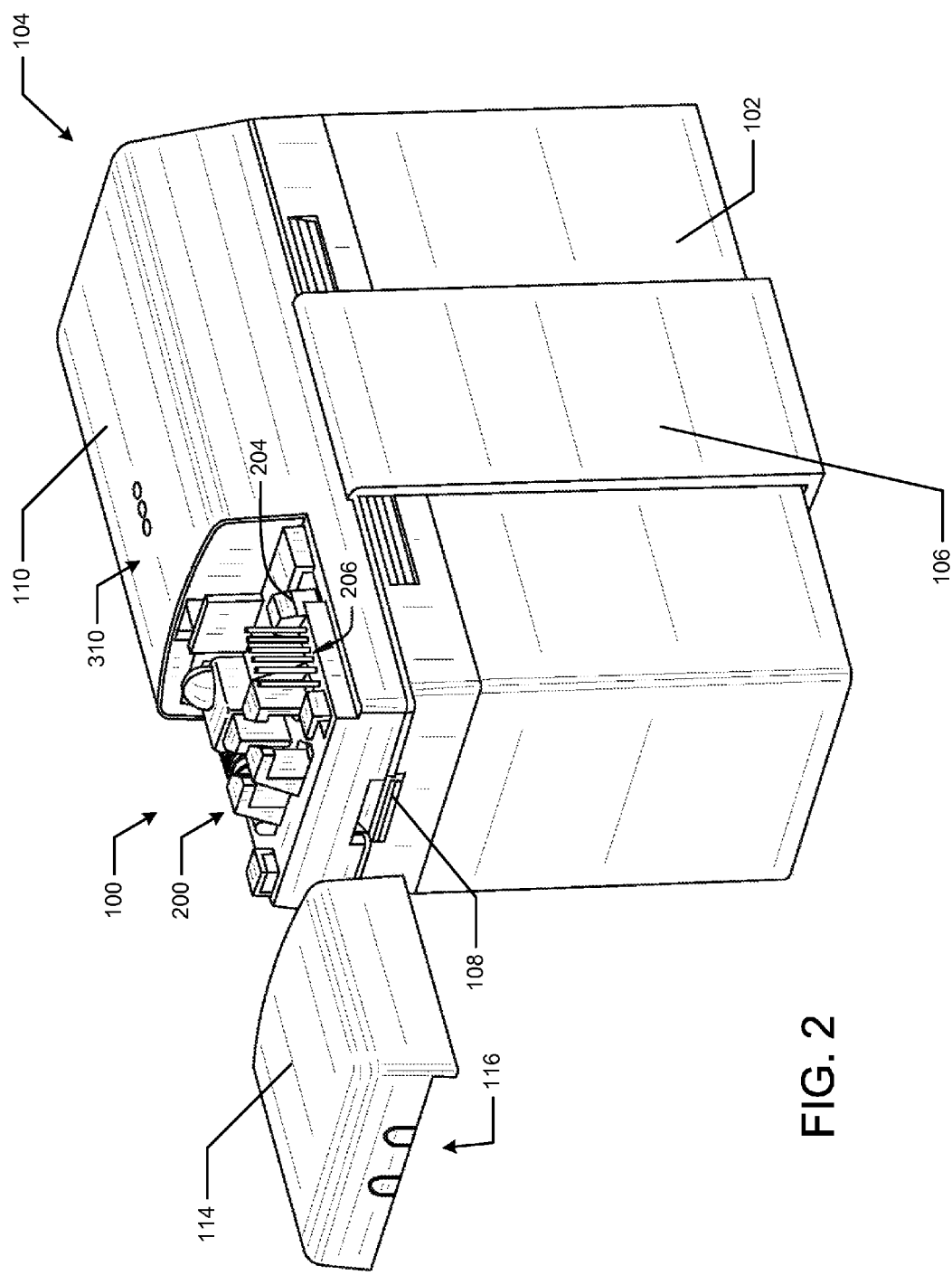
FIG. 2 is an illustration of a battery holder of the battery backup unit system with the connection cover removed according to one embodiment.
Figure 4:
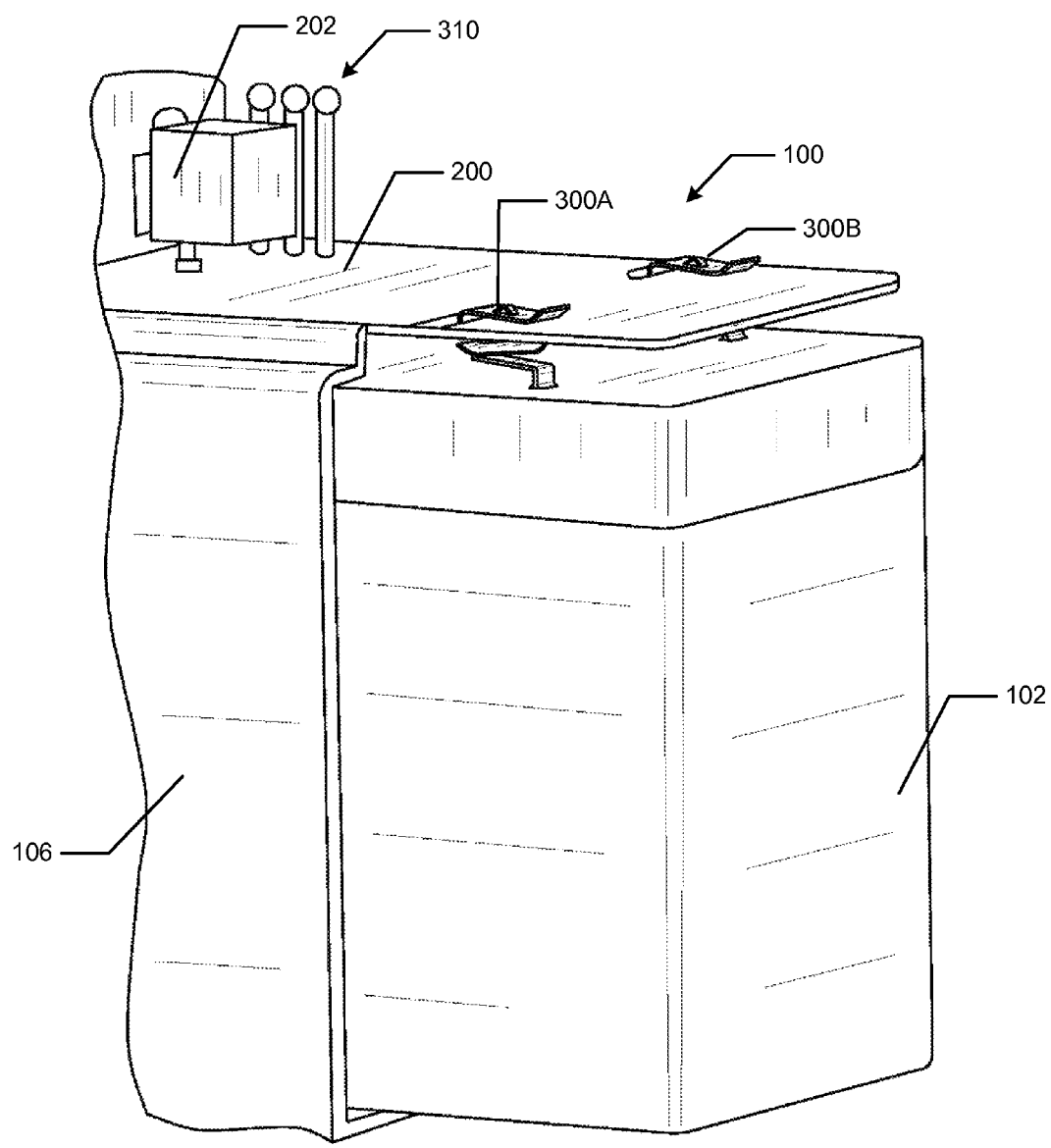
FIG. 4 is an illustration of the battery connection leads in contact with the battery.
Figure 5:
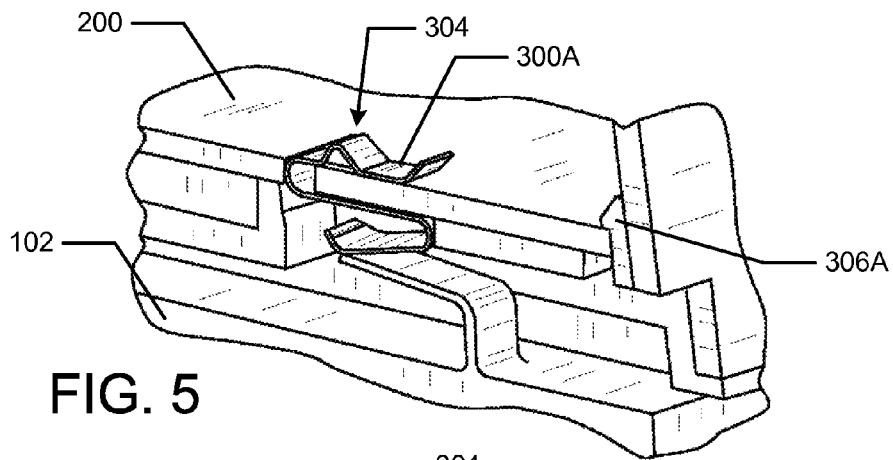
FIG. 5 is an illustration of the battery connection leads in contact with the battery.
Figure 6:
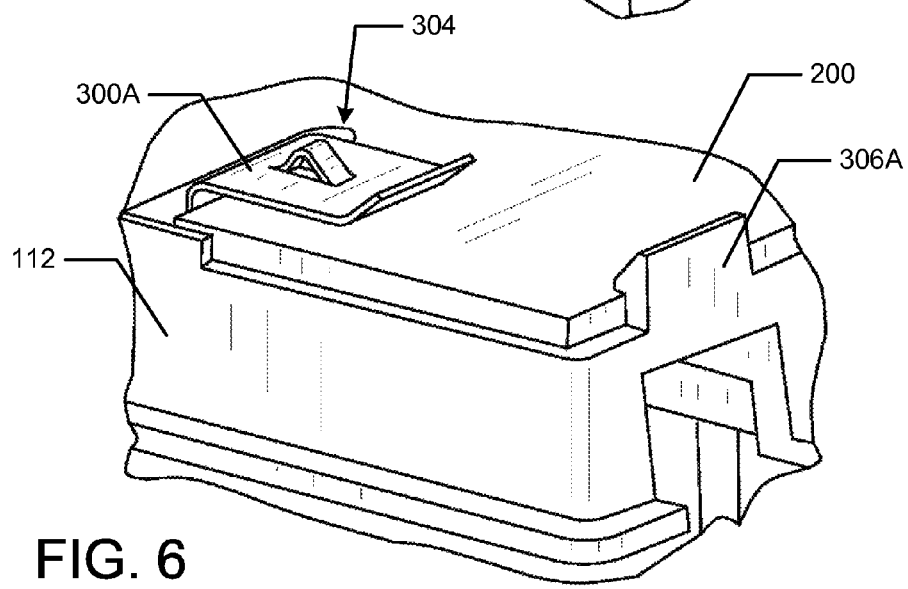
FIG. 6 is an illustration of the circuit board engaged to the battery holder.
Figure 7:
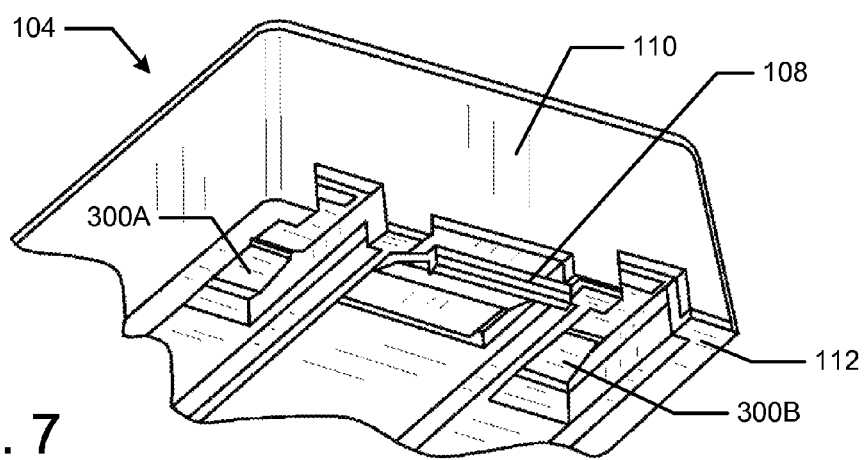
FIG. 7 is an illustration of the battery holder housing base.
Figure 11:
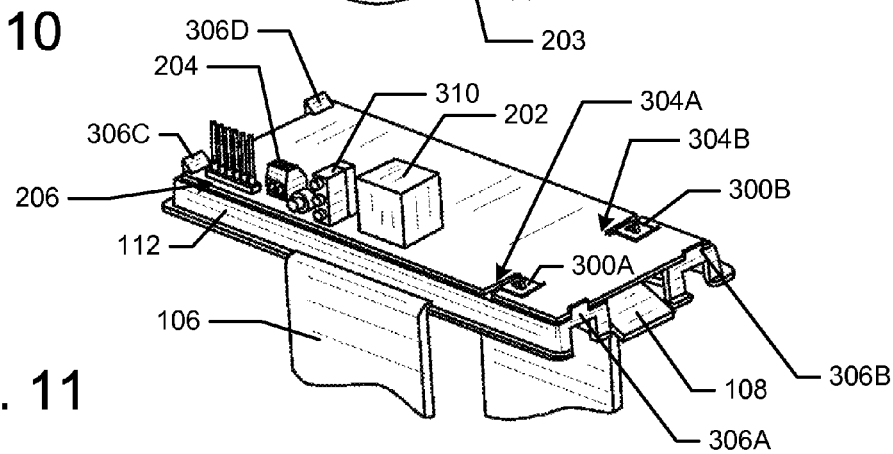
Figure 12:
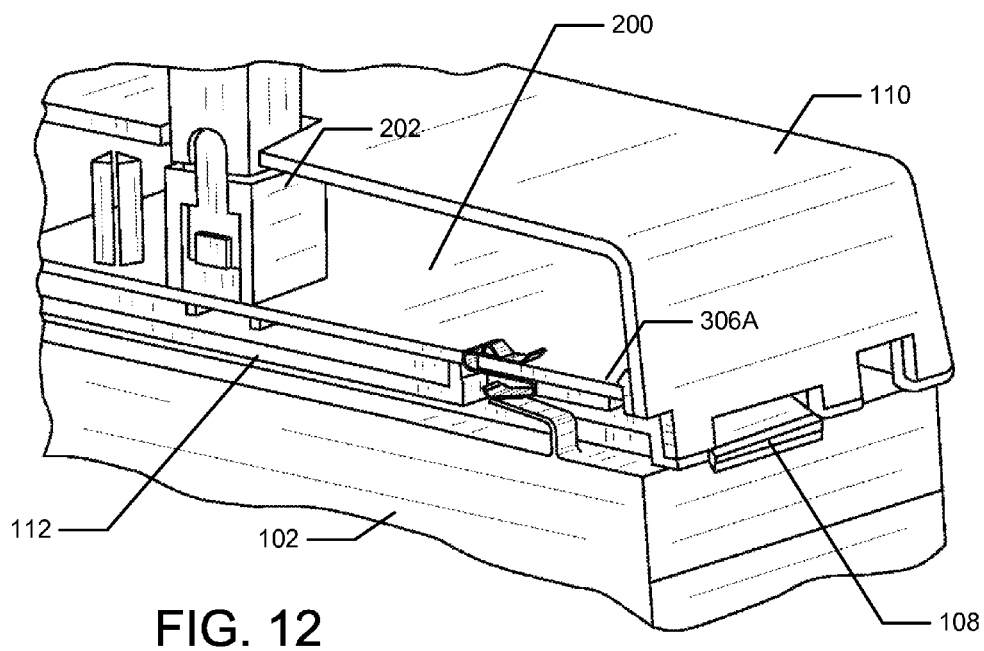

The circuit housing 110 encloses a circuit board 200, as shown in FIGS. 2, 4, and 11 which is held by the housing base 112. In one aspect, the circuit board 200 is configurable and removable. A number of holding tabs 306A-D, as shown in FIGS. 5, 6, 11, and 12, hold the circuit board 200 to the housing base 112.

Figure 3:
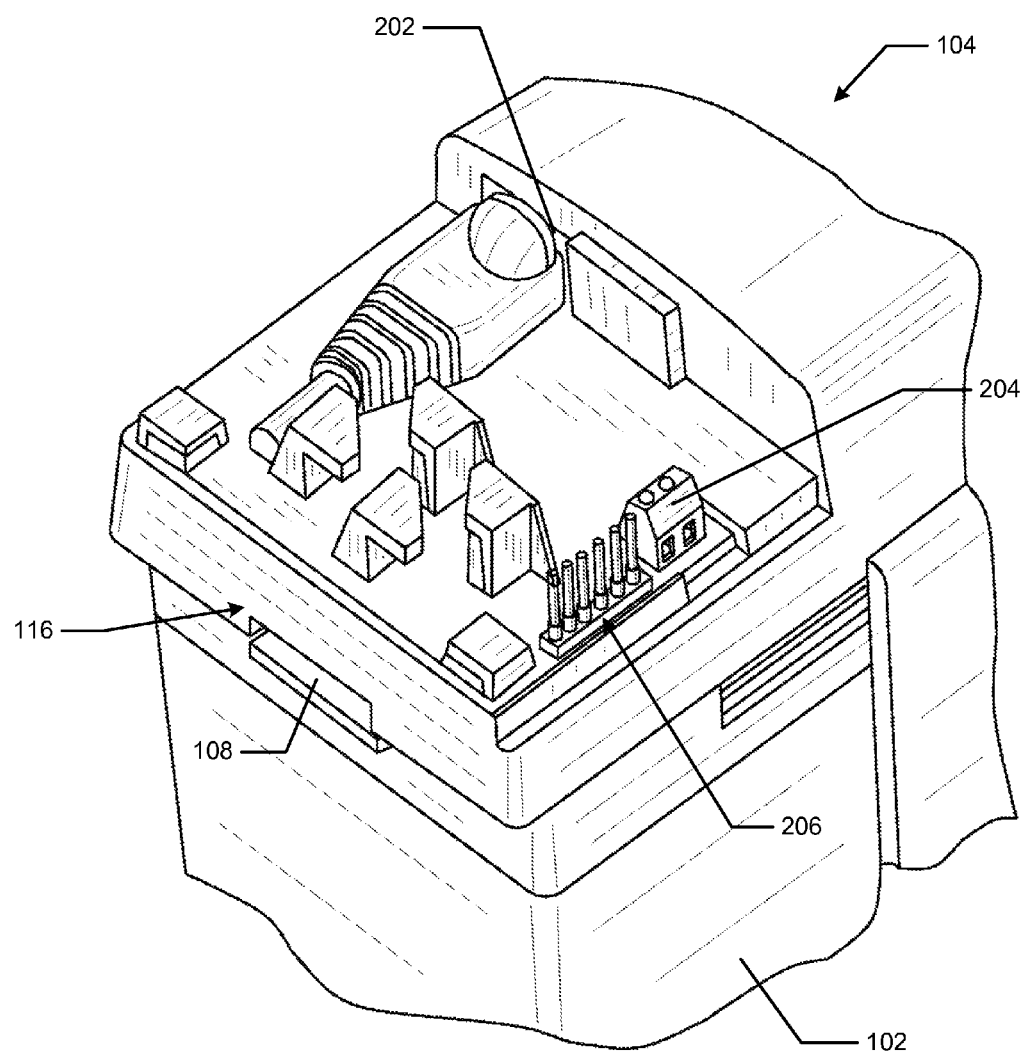
FIG. 3 is an illustration of the connector arrangement according to one embodiment.

The circuit board 200 includes a number of connectors, as shown in FIGS. 2 and 3, for transmitting and receiving data from a telecommunications network. By way of example and not limitation, the circuit board 200 may include an Ethernet connector 202 for receiving or transferring power, a two-pin receptacle 204 to receive and transmit signals to the ONT through a two-pin plug. For example, the two-pin plug and receptacle 204 may be used to receive and transmit voltage signals, digital signals, analog signals, or other communication signals. The circuit board 200 also includes a number of wire wrap pins 206 for transferring and receiving alarm signals. In addition, other signals may also be transmitted and received by any of the connectors on the circuit board 200. The Ethernet connector may receive any Ethernet cable, including a Category 5 (Cat 5) cable having a modular eight-pair eight-conductor (8P8C) connector, commonly referred to as an "RJ-45" cable. The two-pin receptacle 204 consists of an apparatus for securely connecting and retaining wires with a positive and negative contact. Typically, the two-pin receptacle 204 is a screw-down terminal, however other connection arrangements, such as a plug and socket arrangement, may be used. The circuit board 200 also includes a number of wire wrap posts or pins 206. Preferably, the circuit board 200 includes between 3 and 7 wire wrap posts 206, although, some embodiments of the circuit board may include only a single wire wrap post, while others may have 8 or more wire wrap posts. For example, a connection is made to a wire wrap post by placing a number of turns (e.g. seven) of a bare wire with approximately 0.5-1.5 turns of the insulated wire to provide strain relief.

In another embodiment of the BBU system 100, as shown in FIGS. 15-22C, the circuit board 200 includes other connectors for transmitting and receiving power and data from a telecommunications network. By way of example and not limitation, the circuit board 200 may include a two-position screw terminal 800 for receiving power and a seven-terminal push-in block 802 for transmitting the power output by the battery 102. The two-position screw terminal 800 may receive power from any 16-24 AWG cable or may be configured to connect to a CAT 5 cable. The two-position screw terminal 800 includes an apparatus for securely connecting and retaining wires with a positive and negative contact. Typically, two-position screw terminal 800 is a screw-down terminal, however other connection configurations, including a plug and socket arrangement, such as a CAT 5 receptacle, may be used.

The seven-terminal push-in block 802 may be used to transmit voltage and battery alarms or other communication signals. In addition, other signals may also be transmitted and received by any of the connectors on the circuit board 200.

In various embodiments, the circuit board 200 also includes additional features such as a processor (not shown), a reset switch 308 for resetting the output of the BBU and status indicator lights 310, as shown in FIGS. 8, 9, 20A and 20B, which provide visual indications that the BBU system 100 is operating normally, that there is an alarm, or that the battery power level is low, among others.

By way of example, The BBU system 100 can determine if a power cable connected to the BBU system is too long and provide an indication using the status indicator lights 310 that the cable is not suitable for the desired application. In one aspect, when the BBU system is receiving power from a power source, such as an alternating current (A/C) source via an direct current (DC) converter that is connected to the two-position screw terminal 800, the processor (not shown) samples the incoming voltage to determine if it is sufficient to charge the battery 100. The processor samples the voltage approximately 80 times per second. During sampling, one or more of the status indicator lights will illuminate to indicate a lower than expected voltage is being applied to the battery, as at least some portion of the incoming voltage is being diverted from the battery 100. As the cable length between the A/C source and the BBU system 100 increases, the voltage delivered to the BBU system will decrease and cause a status indicator light 310 to illuminate. Thus, the BBU system 100 may be used to determine easily if the cable length used to connect the BBU system to the A/C power source is too long.

In one embodiment, the circuit board 200 may include an integrated cable management system 208, as shown in FIGS. 2 and 3, that consists of a number of projections extending away from the circuit board 200. The integrated cable management system 208 retains and secures any of the variety of cables that may be connected to the circuit board 200. For example, an Ethernet cable connected to the Ethernet connector 202 may be woven through or otherwise engaged with the integrated cable management system 208 to prevent unintentional disconnection from the Ethernet connector 202 or dislodgement from the battery holder 104.

According to another aspect, the circuit board 200 is in electrical communication with battery connection leads 300A-B within the circuit housing 110. The battery connection leads 300A-B are positioned and oriented within the circuit housing 110, such that the battery 102 can properly engage the leads 300A-B and the circuit housing 110, in only one orientation; thus eliminating the possibility of polarity reversal.

As shown in FIGS. 4-7, 11, and 12, the battery connection leads 300A-B are preferably, resilient conductive leaf-type contact prongs that electrically engage the contacts 302A and 302B of the battery 102. The battery connection leads 300A-B may be permanently affixed to the circuit board 200. Alternatively, in one embodiment, the battery connection leads 300A-B may be interchangeable, and are received at the circuit board 200 in respective recesses 304A and 304B of the circuit board 200. In this embodiment, battery connection leads 300A-B of various sizes may be used to accommodate variations in the battery 102 or the battery contacts 302A and 302B.

Figure 17:
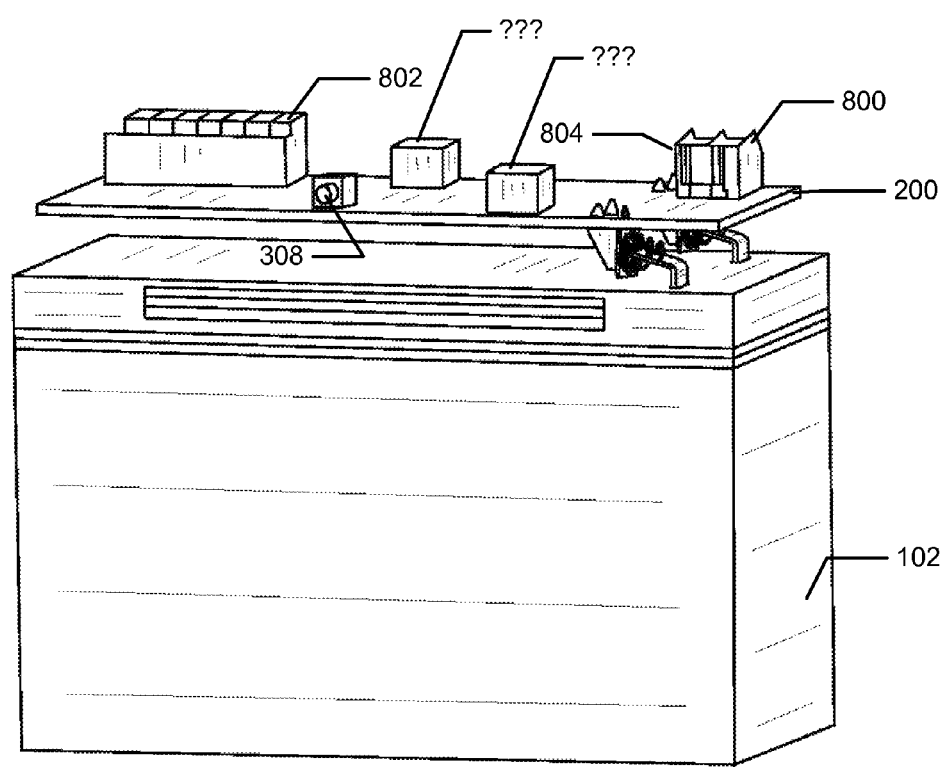
FIG. 17 is an illustration of the cable connectors and battery connection leads in contact with the battery according to one embodiment.
Figure 18:
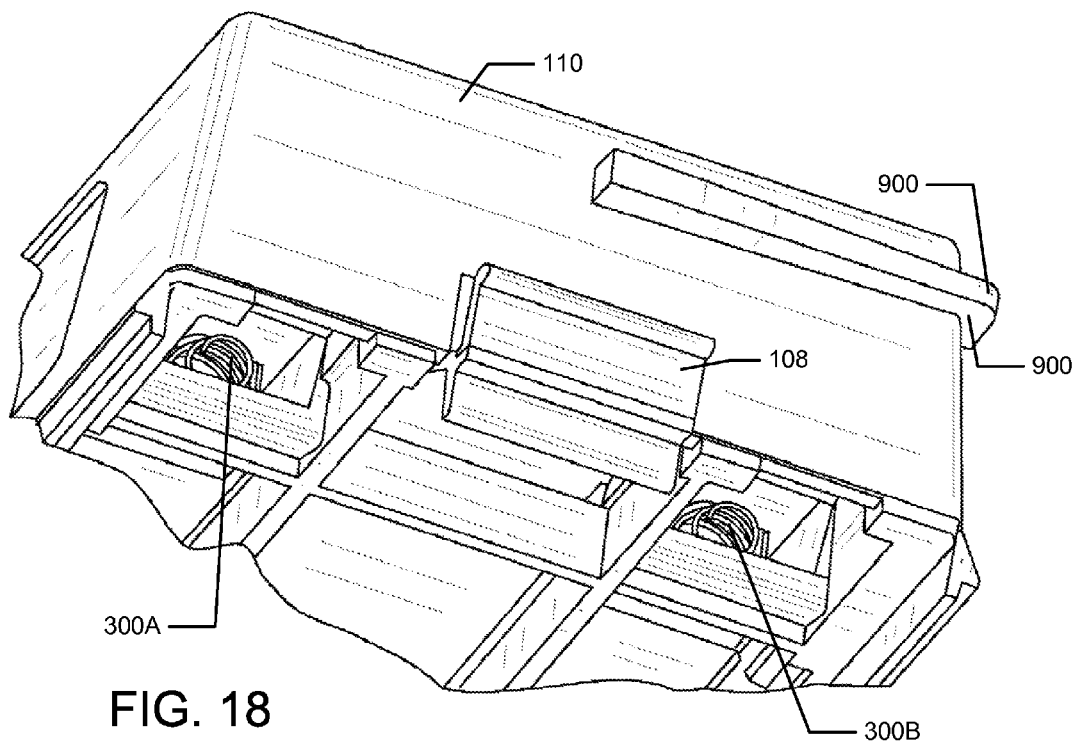
FIG. 18 is an illustration of the circuit housing base according to one embodiment.
Figure 19:
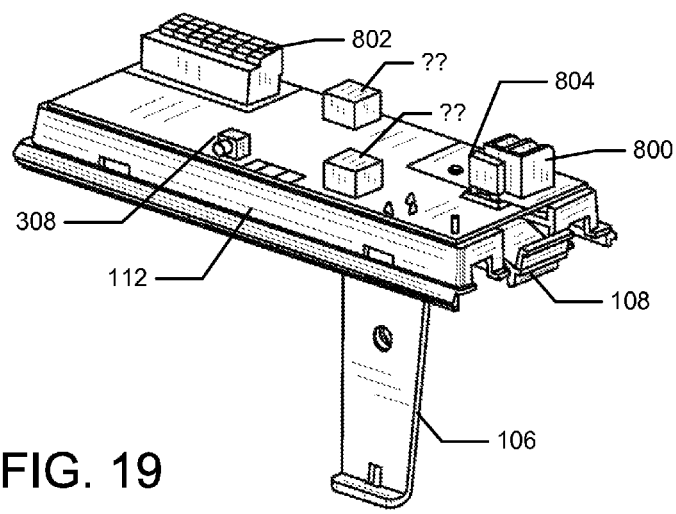
FIG. 19 is an illustration of the battery backup unit system circuit board engaged to the battery holder according to one embodiment.

Similarly, as shown in FIGS. 17 and 18, the battery connection leads 300A-B are preferably, resilient conductive spring-type contacts that electrically engage the contacts 302A and 302B of the battery 102. The battery connection leads 300A-B may be permanently affixed to the circuit board 200.

Figure 20A:
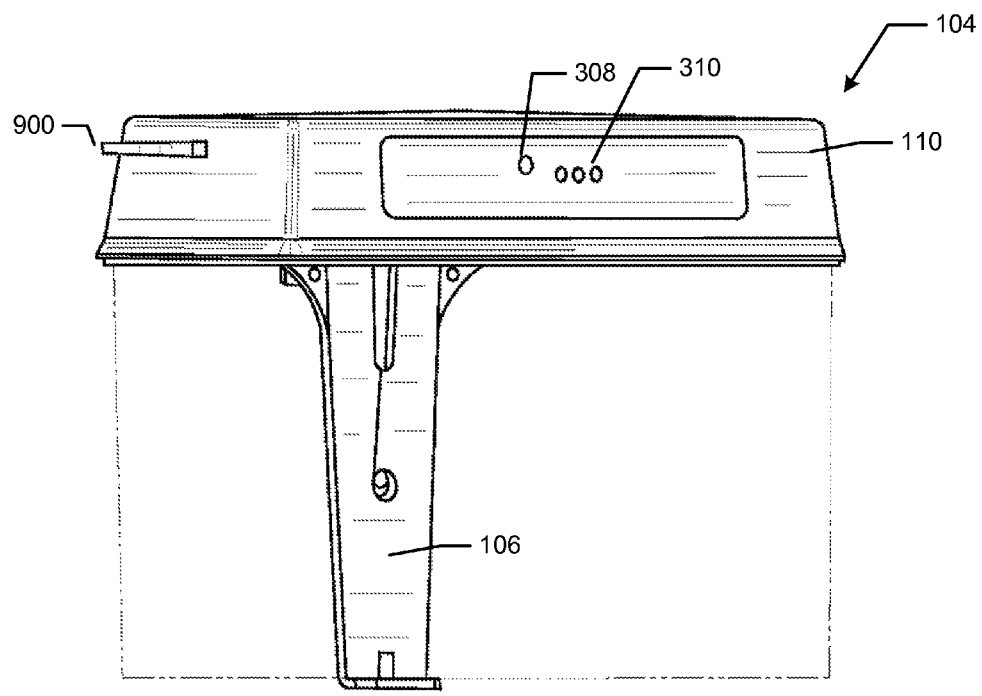
FIGS. 20A-B are illustrations of the battery holder according to one embodiment.
Figure 20B:
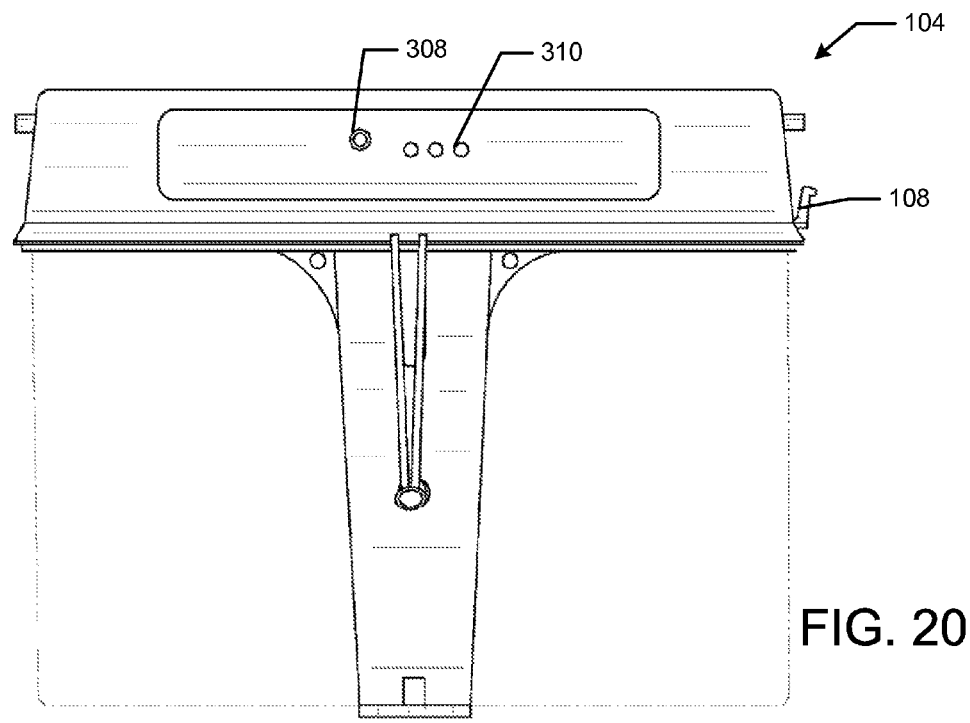
Figure 21A:
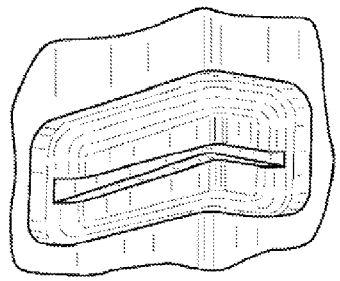
FIGS. 21A-D are illustrations of a battery backup unit system configured for mounting in a modular enclosure according to one embodiment.
Figure 21B:
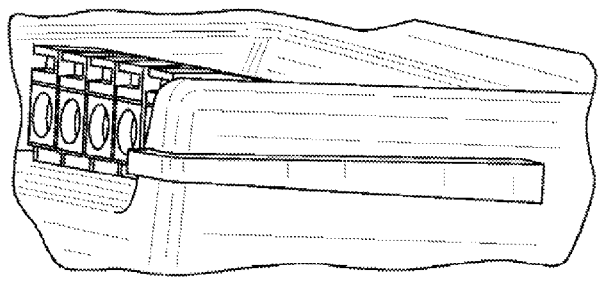
Figure 21C:
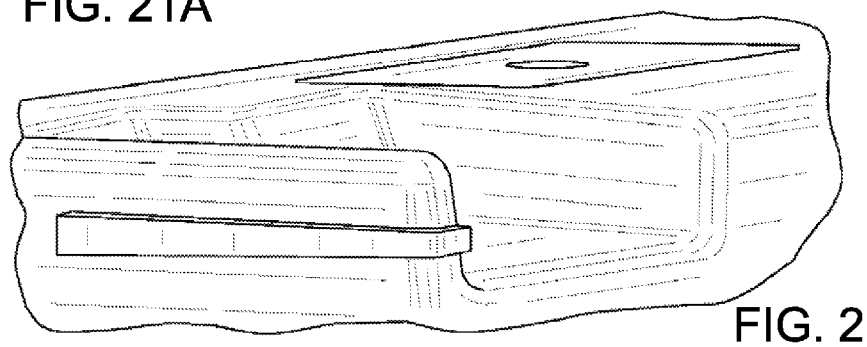
Figure 21D:
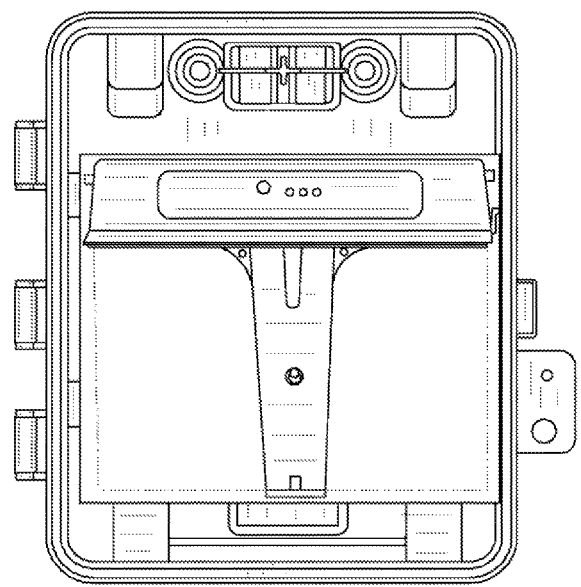

In one embodiment, as shown in FIG. 20B, the battery holder arm 106 includes a thermistor 806 mounted thereon. The thermistor 806 is configures to detect the battery temperature, which in turn may be used to ensure that the correct voltage is applied to the battery during charging thereof.

Figure 13:
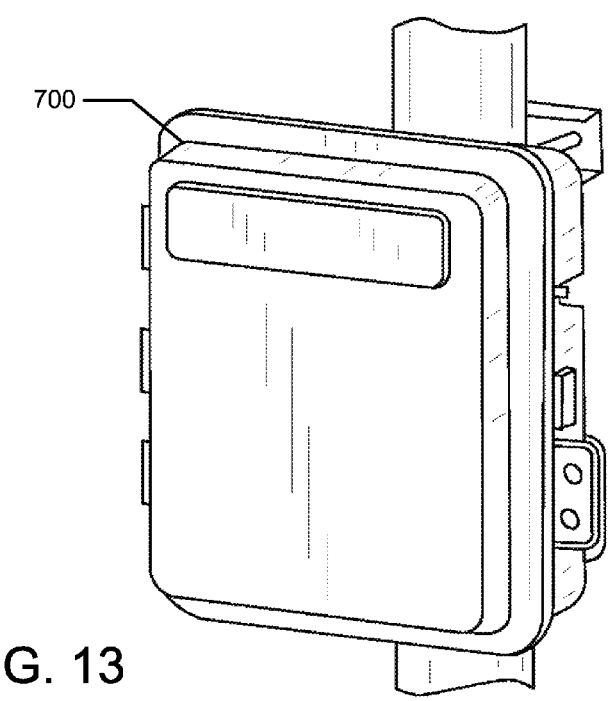
FIG. 13 is an illustration of an optical network terminal enclosure.
Figure 14A:
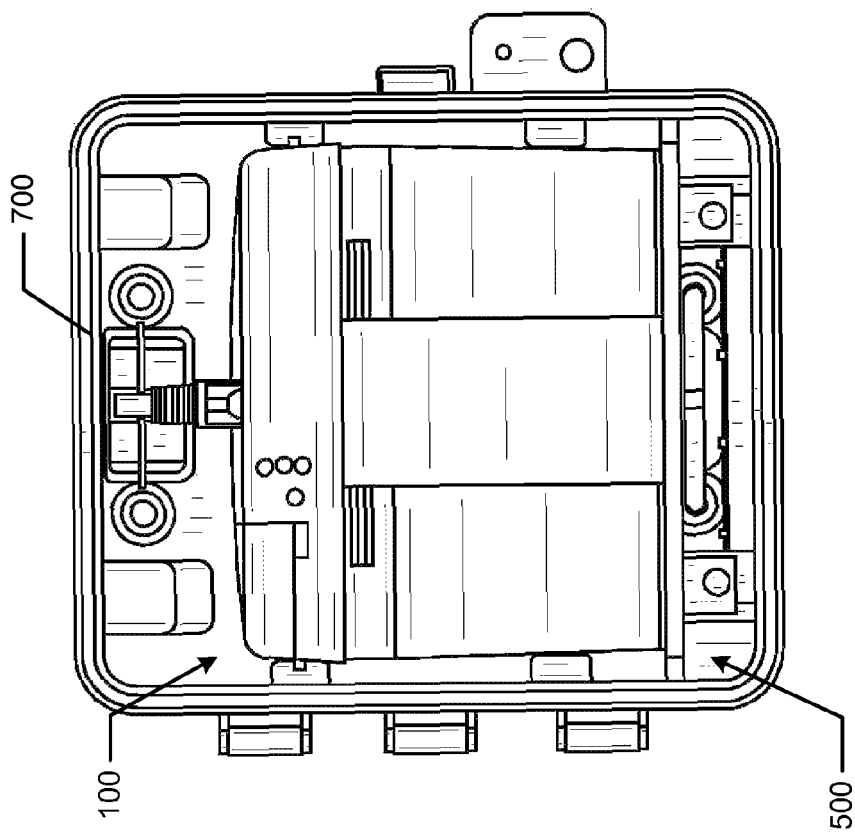
FIGS. 14A-B are illustrations of a battery backup unit system mounted into an optical network terminal enclosure according to one embodiment.
Figure 14B:
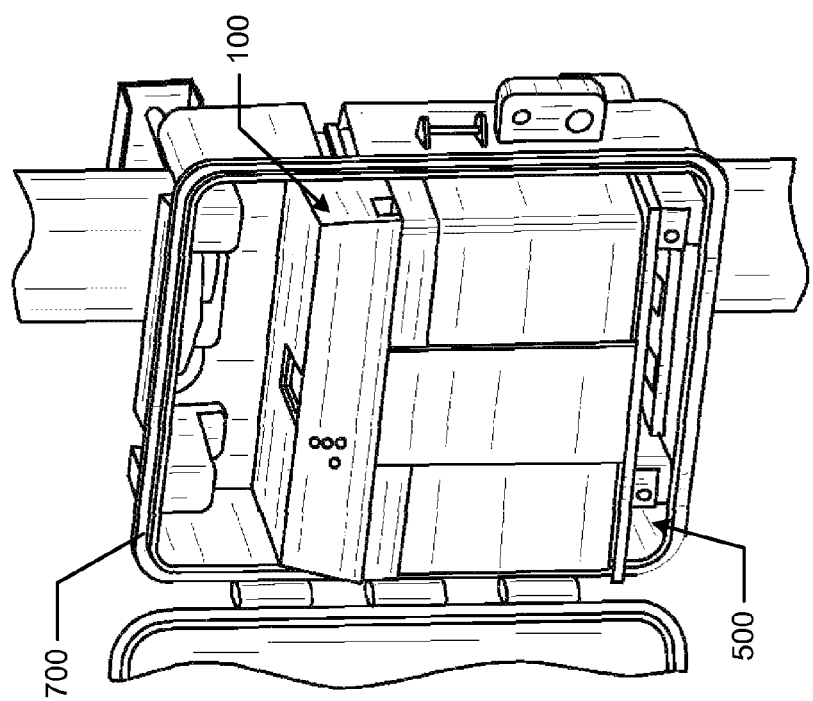
Figure 15:
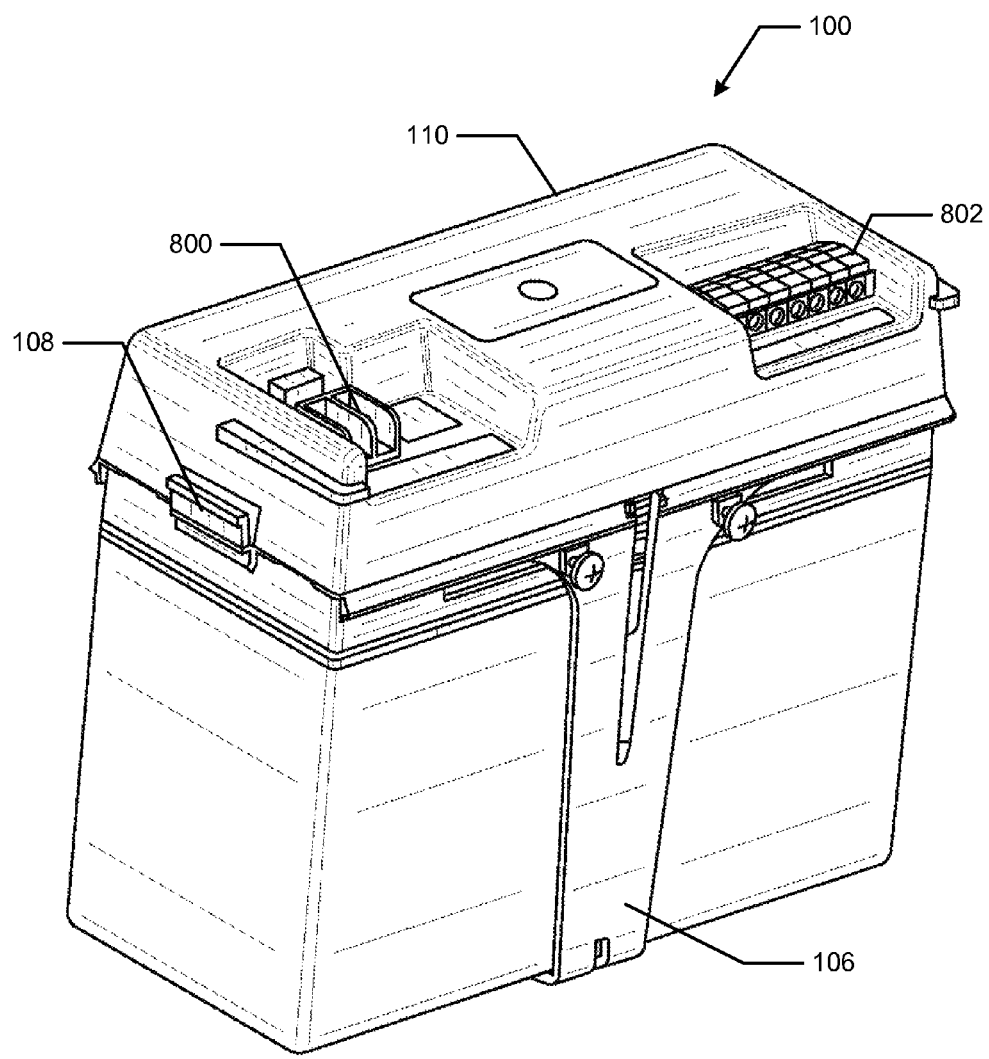
FIG. 15 is an illustration of another battery backup unit system according to one embodiment
Figure 16:
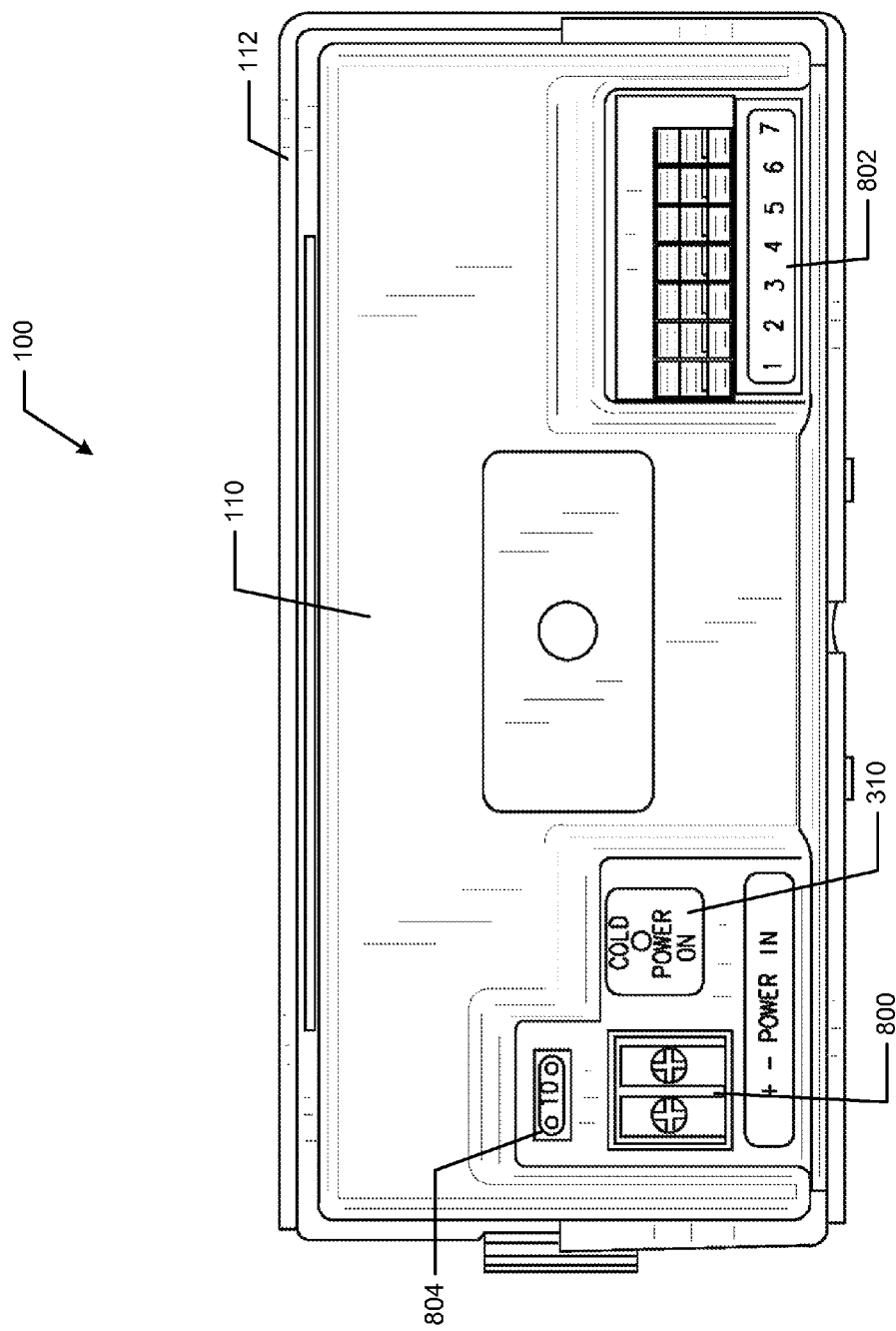
FIG. 16 is a top plan view of the battery backup unit system according to one embodiment.

FIGS. 13-14B depict one embodiment of the BBU system 100 as positioned within a modular enclosure 700. FIGS. 21A-D depict one embodiment of the BBU system 100 that includes protrusions or tongues 900 configured to be received in the modular enclosure 700. The tongues 900 are affixed to or alternately, integrated into the battery holder 104. As shown, the tongues may be tapered to slidably engage in tapered grooves 902 of the modular enclosure 700. In various other embodiments, other engagement configurations including, but not limited to friction fit, snap-fit, or non-tapered tongues 900 and grooves 902 may be used to position the BBU system 100 within the enclosure 700.

Figure 22A:
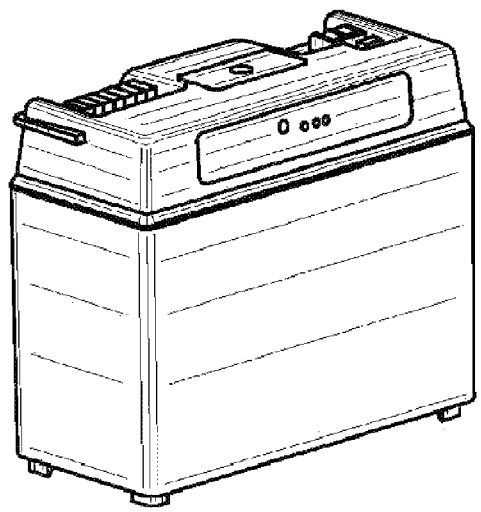
FIGS. 22A-C are illustrations of a battery backup unit system configured for portable mounting or placement according to one embodiment.
Figure 22B:
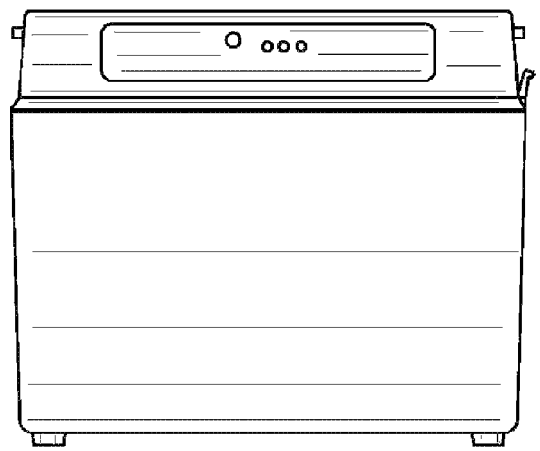
Figure 22C:
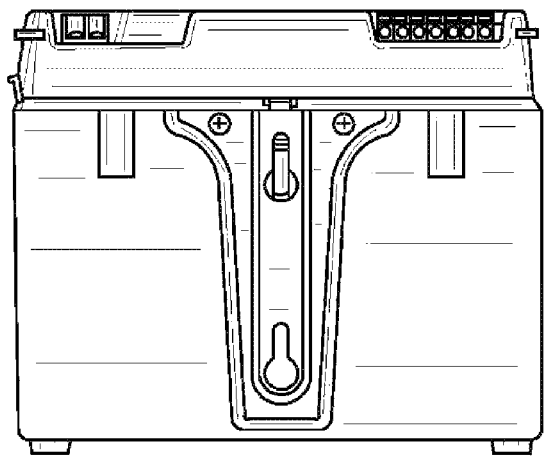

FIGS. 22A-C depict another embodiment of the BBU system that is configured for portable use and placement. For example, this embodiment of the BBU system 100 may be used indoors and includes a battery housing 1000 with protruding legs 1002 and an integrated hanging arm 1004. In this embodiment, the circuit housing 100 is removabely engaged to the battery housing 1000. The BBU system 100 may be placed on a tabletop and supported by the legs 1002. Alternatively, the BBU system 100 may be mounted on a wall using the integrated hanging arm 1004 that defines on or more openings 1006 for receiving a nail, screw, or other suitable object protruding from a wall.

It will be appreciated that the device and method of the present invention are capable of being incorporated in the form of a variety of embodiments, only a few of which have been illustrated and described above. The invention may be embodied in other specific forms without departing from its spirit or essential characteristics. The described embodiments are to be considered in all respects only as illustrative and not restrictive and the scope of the invention is, therefore indicated by the appended claims rather than by the foregoing description. All changes which come within the meaning and range of equivalency of the claims are to be embraced within their scope.

What is claimed is:

1. A battery backup system for a discrete optical network terminal (ONT) to provide an alarm or to provide emergency power to the ONT, the system comprising:
   a backup battery external to the ONT; and
   a battery holder removably engaged to the battery, the battery holder comprising:
      a circuit housing holding a circuit board having a plurality of connectors, the circuit board in communication with and receiving power from an alternating current (A/C) to direct current (D/C) converter; wherein the plurality of connectors comprises a communication cable connector and a seven-pin connector, wherein the seven-pin connector transmits power and at least one alarm indicating one or more of a lower battery power level, or a battery in normal use; the plurality of connectors may also transmit a communication signal to the ONT;
      at least one battery engagement tab integral with the circuit housing and protruding from the circuit housing to directly and compressively engage the ONT backup battery at an outer periphery of the backup battery; and
      a battery connection lead, wherein the at least one of the battery engagement tab and the battery connection lead are engaged to the battery holder and engage the terminal connector of the battery in a particular orientation to prevent a polarity reversal of a battery connection.

2. The battery backup system of claim 1, wherein the circuit board further comprises at least one of an alarm indicator and a reset switch.

3. The battery backup system of claim 1, wherein the battery is a lithium-ion battery, a LiFePO4 battery or a rechargeable lead acid battery.

4. The battery backup system of claim 1, wherein the battery connection lead is a leaf-type contact prong or a spring-type contact prong.

5. The battery backup system of claim 1, wherein the circuit housing further comprises a housing base mechanically engaged with the circuit board and a removable access cover to provide access to the circuit board.

6. The battery backup system of claim 1, further comprising a thermistor to detect a battery temperature.

7. The battery backup system of claim 6, wherein the thermistor regulates a voltage to charge the battery.

8. The battery backup system of claim 1, wherein the circuit housing comprises a housing base and an access cover, wherein the circuit board is held to the housing base, and the plurality of connectors is enclosed between the housing base and the access cover.

9. The battery backup system of claim 1, wherein the battery and the engagement tab are on opposite sides of the plurality of connectors.

10. The battery backup system of claim 1, wherein the circuit board is configured to automatically switch to the battery to provide the emergency power to the ONT when utility power for the ONT fails.

11. A battery cover in a battery system for an optical network terminal (ONT) to prevent a polarity reversal of a connected backup battery external to the ONT, the battery cover comprising:
    a battery engagement tab integral with a circuit housing and protruding from the circuit housing to directly and compressively engage the backup battery at an outer periphery of the backup battery; and
    at least two at least two battery connection leads to permit electrical communication with the battery, wherein the at least two battery connection leads and the battery engagement tab are oriented within the battery cover to engage the battery in a particular orientation to prevent the polarity reversal; and
    the circuit housing containing a circuit board having a plurality of connector,
    the circuit board in communication with and receiving power from an alternating current (A/C) to direct current (D/C) converter; wherein at least one of the plurality of connectors is a seven-pin connector that transmits power and at least one alarm indicating one or more of a lower battery power level, or a battery in normal use; the plurality of connectors may also transmit a communication signal to the ONT.

12. The battery cover of claim 11 where the plurality of connectors further comprises a communication cable connector or a two-pin receptacle.

13. The battery cover of claim 11, wherein at least two connectors of the plurality of connectors are a same type of connector.

14. The battery cover of claim 11, wherein at least one of the battery connection leads is a leaf-type contact prong or a spring-type contact prong.

15. The battery cover of claim 11, further comprising a thermistor to detect a battery temperature.

16. The battery cover of claim 15, wherein the thermistor is in electrical communication with the circuit board.

17. The battery cover of claim 16, wherein the thermistor regulates a voltage to charge the battery.

18. The battery backup system of claim 15, wherein the thermistor is disposed within the battery cover.

19. A battery backup system comprising:
    a backup battery external and distinct from a powered device; and
    a battery enclosure comprising:
       a thermistor separate and distinct from the battery to detect a battery temperature;
       a circuit housing holding a circuit board comprising a plurality of connectors, the circuit board in communication with and receiving power from an alternating current (A/C) to direct current (D/C) converter; where the plurality of connectors includes a seven-pin connector and a two-pin receptacle, wherein the seven-pin connector transmits power and an at least one alarm indicating one or more of a lower battery power level, or a battery in normal use; the plurality of connectors may also transmit a communication signal to the powered device;
- at least one battery engagement tab integral with the circuit housing and protruding from the circuit housing to directly and compressively engage the battery at an outer periphery of the backup battery; and
- a battery connection lead, where at least one of the battery engagement tab and the battery connection lead engage the connector of the battery in a particular orientation to prevent a polarity reversal of the battery.

20. The battery backup system of claim 19, further comprising a cable management system to secure at least one of the plurality of connectors.

21. The battery backup system of claim 19, wherein the plurality of connectors further comprises a receptacle for receiving three, four, five, or six wires.

22. The battery backup system of claim 19, wherein the plurality of connectors further comprises a receptacle for receiving eight or more wires.

23. The battery backup system of claim 19, wherein the plurality of connectors further comprises a wire-wrap post.

24. The battery backup system of claim 19, wherein the circuit board includes a two-position terminal.

25. The battery backup system of claim 24, wherein the two-position terminal retains wires for commercial utility power.

26. The battery backup system of claim 19, wherein the battery connection lead is a spring-type contact prong.

* * * * *